United States Patent [19]

Takahashi

[11] Patent Number: 5,389,815
[45] Date of Patent: Feb. 14, 1995

[54] SEMICONDUCTOR DIODE WITH REDUCED RECOVERY CURRENT

[75] Inventor: Hideki Takahashi, Fukuoka, Japan

[73] Assignee: Mitsubishi Denki Kabushiki Kaisha, Tokyo, Japan

[21] Appl. No.: 49,411

[22] Filed: Apr. 20, 1993

[30] Foreign Application Priority Data

Apr. 28, 1992 [JP] Japan .................. 4-110057
Nov. 9, 1992 [JP] Japan .................. 4-298644
Mar. 31, 1993 [JP] Japan .................. 5-073325

[51] Int. Cl.⁶ ............................. H01L 29/90
[52] U.S. Cl. .................. 257/605; 257/475;
   257/481; 257/483; 257/493; 257/496
[58] Field of Search .......... 257/471, 475, 481, 483,
   257/493, 496, 603, 605

[56] References Cited

U.S. PATENT DOCUMENTS 4,089,020  5/1978  Ikeda et al. .................. 257/475

FOREIGN PATENT DOCUMENTS 52-24465   2/1977  Japan .
54-113273  9/1979  Japan .................. 257/110
60-74481   4/1985  Japan .
61-144871  7/1986  Japan .................. 257/653
1-138754   5/1989  Japan .................. 257/471
1-257370  10/1989  Japan .................. 257/483

Primary Examiner—Ngan V. Ngo
Attorney, Agent, or Firm—Oblon, Spivak, McClelland, Maier, & Neustadt

[57] ABSTRACT

A high speed soft recovery diode having a large breakdown voltage is disclosed. Anode P layers (3) are selectively formed in a top portion of an N⁻ body (2). A P⁻ layer (4a) is disposed in the top portion of the N⁻ body (2) so as to be spacewise complementary to the anode P layers (3). In the N⁻ body (2), P regions (5) are selectively formed below the P⁻ layer (4a). On the N⁻ body (2), an anode electrode (6) is disposed in contact with both the P⁻ layer (4a) and the anode P layers (3). A cathode electrode (7) is disposed under the N⁻ body (2) through a cathode layer (1). When the diode is reverse-biased, a depletion layer does not have a sharply curved configuration due to the P regions (5). Hence, concentration of electric field is avoided and a breakdown voltage would not deteriorate. During forward-bias state of the diode, injection of excessive holes from the anode P layers (3) into the N⁻ body (2) is prevented, thereby reducing a recovery current.

11 Claims, 34 Drawing Sheets

SEMICONDUCTOR DIODE WITH REDUCED RECOVERY CURRENT

BACKGROUND OF THE INVENTION

1. Field of the Invention

The present invention relates to a diode.

2. Description of the Background Art

FIG. 1 is a cross sectional view showing a structure of a conventional diode 200. In FIG. 1, an N− body 2 and an anode P layer 31 are stacked in this order on a cathode N+ layer 1. A cathode electrode 7 is disposed under the cathode N+ layer 1 and an anode electrode 6 is disposed on the anode P layer 31.

FIG. 2 shows a characteristic of a current which flows in the diode 200 in response to a voltage applied between the anode electrode 6 and the cathode electrode 7. When a higher potential is given to the anode electrode 6 than to the cathode electrode 7, the diode 200 is forward-biased. At a certain threshold voltage $V_{TH}$ (about 0.6 V), current suddenly starts flowing.

This is because the resistance of the N− body 2 substantially drops due to shift of holes from the anode P layer 31 to N− body 2 at the threshold voltage $V_{TH}$ or a voltage higher than that, and hence, the current capacity of the diode 200 increases.

On the other hand, a lower potential applied to the anode electrode 6 than to the cathode electrode 7 renders the diode 200 biased in the reverse direction. Hence, current will not be initiated until a certain low potential is reached. With a potential below that certain low potential, current starts flowing. A voltage applied to the diode 200 at the initiation of current is a breakdown voltage. In FIG. 2, the breakdown voltage is indicated at $V_{BR}$.

To increase the breakdown voltage $V_{BR}$, the electric field, developed at an end portion of the anode P layer 31, has to be weakened. An approach taken to weaken the electric field is to provide a breakdown voltage in the diode holding structure such as a guard ring, although no such structure is shown in FIG. 1. If such structure is to be provided, the device structure is designed such that the breakdown voltage yielded by the anode P layer 31, N− body 2 and the cathode N+ layer 1 determines the breakdown voltage $V_{BR}$ while considering the one-dimensional structure of the anode P layer 31, N− body 2 and the cathode N+ layer 1 along their thicknesses.

FIG. 3 shows a characteristic of a current which flows when the diode 200 is forward-biased first and subsequently reverse-biased with a voltage which is lower than the breakdown voltage $V_{BR}$. In the graph, a current I is measured along the vertical axis in such a manner that the current I during the forward-bias state is shown with positive values. The horizontal axis of the graph denotes time T. Zero on the horizontal axis corresponds to a time when the forward-bias state is changed to the reverse bias state.

Current keeps flowing in the diode 200 even after the biasing condition changes from the forward bias state to the reverse bias state. During the forward-bias state, holes had migrated to the N− body 2 from the anode P layer 31. With a reverse bias applied to the diode 200, excessive holes in the N− body 2 are attracted to the anode electrode 6 and excessive electrons are attracted to the cathode electrode 7.

Hence, the current I decreases for a short period of time after the change from the forward-bias state to the reverse-bias state. Current of the reverse bias direction then starts to flow (I<0), and at last gradually terminates with end of migration of all carriers such as the excessive holes from the N− body 2. The maximum value of the reverse direction current at this stage is called "recovery current $I_{RR}$." The current characteristic which is observed after change from the forward-bias state to the reverse-bias state, as that shown in FIG. 3, is called "recovery characteristic."

A diode, much needed in general, is a high speed soft recovery diode which is characterized by its small and gradual termination of the recovery current $I_{RR}$. Without such a diode, an element connected in parallel to the diode is subjected to a surge voltage of the reverse direction, consequently destroying the element.

When the diode 200 constructed as shown in FIG. 1 is forward-biased, holes tend to excessively flow from the anode P layer 31 to the N− body 2, and therefore, the recovery current $I_{RR}$ grows accordingly. Hence, improvement in the recovery characteristic of the diode of such structure should require implantation of a hole lifetime killer in the anode P layer 31, the N− body 2 and the cathode N+ layer 1 to decrease the lifetime of the holes.

However, implantation of a hole lifetime killer not only adds to process complexity, but also increases the ON-resistance (a resistance of the forward-biased diode). Above all, injection of the excessive holes from the anode P layer 31 is left uncorrected.

Under such circumstances, a high speed soft recovery diode structure has been proposed which does not invite migration of excessive holes without introducing a hole lifetime killer. FIG. 4 is a cross sectional view of a diode 300 which is disclosed in literature such as "Proceeding of the 3rd ISPSD" (pgs 109 and 113) and Japanese Laid-Open Gazette No. 52-24465.

Unlike the structure shown in FIG. 1, anode P layers 3 are selectively formed in a top portion of an N− body 2. In the top portion of the N− body 2 where there are no P layers 3, a shallow P− layer 4 is provided. In some cases, the P− layer 4 is not disposed and an anode electrode 6 and the N− body 2 form a Schottky barrier diode.

In comparison with the diode 200, less holes flow from the anode P layers 3 during the forward-bias state of the diode 300 since the anode P layers 3 are selectively disposed. In other words, the size of the anode P layers 3 are formed in the top portion of the N− body 2 controls the amount of injection of the holes into the N− body 2.

However, compared with the diode 200, the diode 300 easily causes the concentration of an electric field around a shoulder portion 3a of the anode P layers 3 and also around the P− layer 4, which in turn decreases the breakdown voltage $V_{BR}$. To avoid this, a wide aperture cannot be formed between the anode P layers 3. That is, the aperture of the anode P layers 3 must be formed in a certain limited width which would not invite a large decrease in the breakdown voltage $V_{BR}$.

SUMMARY OF THE INVENTION

A semiconductor device of a first aspect of the invention comprises: a first conductivity type first semiconductor layer; second conductivity type second semiconductor layers of a relatively high concentration, the second semiconductor layers being selectively formed in a top major surface of the first semiconductor layer;

at least one third semiconductor layer of the second conductivity type having a relatively high concentration, the third semiconductor layer being selectively formed in the first semiconductor layer at a region between neighboring ones of the second semiconductor layers; and a second conductivity type fourth semiconductor layer of relatively low concentration, the fourth semiconductor layer being formed in the top major surface of the first semiconductor layer at a region between neighboring ones of the second semiconductor layers.

The semiconductor device preferably further comprises a first conductivity type fifth semiconductor layer of a higher concentration than the concentration of the first semiconductor layer, the fifth semiconductor layer being disposed under a bottom major surface of the first semiconductor layer.

The semiconductor device preferably still further comprises a first electrode which is disposed in contact with both the second semiconductor layers and the fourth semiconductor layer.

The semiconductor device preferably still further comprises a second electrode which is disposed under a bottom major surface of the fifth semiconductor layer.

The semiconductor device preferably comprises a plurality of the third semiconductor layers.

The second and the third semiconductor layers may be connected to each other.

The third semiconductor layer preferably has a column-like configuration.

The second semiconductor layers preferably surround said fourth semiconductor layer in said major top surface of said first semiconductor layer.

The second and the third semiconductor layers may be insulated from each other.

The second semiconductor layers may surround the fourth semiconductor layer in the major top surface of the first semiconductor layer.

In a second aspect, a semiconductor device comprises: a first conductivity type first semiconductor layer; second conductivity type second semiconductor layers selectively formed in a top major surface of the first semiconductor layer; at least one third semiconductor layer of the second conductivity type selectively formed in the first semiconductor layer at a region between neighboring ones of the second semiconductor layers; and a Schottky barrier layer formed in the top major surface of the first semiconductor layer at a region between neighboring ones of the second semiconductor layers.

The semiconductor device may further comprise a first conductivity type fourth semiconductor layer of a higher concentration than the concentration of the first semiconductor layer, the fourth semiconductor layer being disposed under a bottom major surface of the first semiconductor layer.

The semiconductor device may still further comprise a first electrode which contacts to both the second semiconductor layers and the Schottky barrier layer electrically.

The semiconductor device may further comprise a metal on said first semiconductor layer to form said Schottky barrier.

The semiconductor device may still further comprise a second electrode which is disposed under the bottom major surface of the fourth semiconductor layer.

The semiconductor device preferably comprises a plurality of the third semiconductor layers.

The semiconductor device of the second aspect may require that the second and the third semiconductor layers are connected to each other.

Further, the third semiconductor layer may have a column-like configuration.

The second semiconductor layers preferably surround said fourth semiconductor layer in said major top surface of said first semiconductor layer.

The second and the third semiconductor layers may be insulated from each other.

In addition, the second semiconductor layers preferably surround the fourth semiconductor layer in the major top surface of the first semiconductor layer.

The present invention also relates to a method of manufacturing a semiconductor device. The method comprises the steps of: (a) preparing a first conductivity type first semiconductor layer; (b) selectively forming second conductivity type second semiconductor layers of a relatively high concentration in a top major surface of the first semiconductor layer; (c) selectively forming at least one third semiconductor layer of second conductivity type in the first semiconductor layer at a region between neighboring ones of the second semiconductor layers; and (d) forming an electrode on the structure which has been fabricated so far through the steps (a) to (c).

The step (a) preferably includes the step of (a-1) forming a first conductivity type fifth semiconductor layer under a bottom major surface of the first semiconductor layer such that the fifth semiconductor layer has a higher concentration than the concentration of the first semiconductor layer.

The step (b) preferably includes the steps of: (b-1) selectively coating the top surface of the first semiconductor layer; and (b-2) implanting first ions of the second conductivity type into the structure obtained by the step (b-1) to thereby form the second semiconductor layers.

The step (c) preferably includes the steps of: (c-1) selectively coating the top surface of the first semiconductor layer; and (c-2) implanting second ions of the second conductivity type into the structure obtained by the step (c-1) to thereby form the third semiconductor layer.

The step (d) may include the step of (d-1) forming a Schottky barrier layer or a second conductivity type fourth semiconductor layer of a relatively low concentration, in the top major surface of the first semiconductor layer at a region between neighboring ones of said second semiconductor layers.

The electrode preferably forms a Schottky barrier layer in the top major surface of the first semiconductor layer at a region between neighboring ones of the second semiconductor layers.

The step (d-1) may include the step of (d-2) thermally diffusing atoms of the electrode into the first semiconductor layer to thereby define a second conductivity type fourth semiconductor layer in the top major surface of the first semiconductor layer between neighboring ones of the second semiconductor layers such that the fourth semiconductor layer has a lower concentration than the concentration of the third semiconductor layer.

Alternatively, the step (d) may include the step of (d-3) implanting third ions of the second conductivity type from above to thereby define a second conductivity type fourth semiconductor layer in the top major surface of the first semiconductor layer between neighboring ones of the second semiconductor layers such that the fourth semiconductor layer has a lower concentration than the concentration of the third semiconductor layer.

The step (d) may further include the step of (d-4) disposing the electrode on an entire surface of the structure which has been fabricated so far through the steps (a) to (c). The step (d-4) may be performed before the step (d-3).

Alternatively, the step (d) may further include the step of (d-5) disposing the electrode on an entire surface of the structure which has been fabricated so far through the steps (a) to (c) and (d-3).

The step (d) may further include the steps of: (d-6) disposing a metal on an entire surface of the structure which has been fabricated so far through the steps (a) to (c) to form the Schottky layer; and (d-7) disposing the electrode on an entire surface of the structure which has been fabricated so far through the steps (a) to (c) and (d-6).

A method of manufacturing a semiconductor device in still other aspect of the present invention comprises the steps of: (a) preparing a first conductivity type first semiconductor layer; (b) selectively forming at least one second conductivity type second semiconductor layer of a relatively high concentration in the first semiconductor layer; (c) selectively forming a second conductivity type third semiconductor layer of a relatively high concentration such that the second semiconductor layer is held between the third semiconductor layers in the top major surface of the first semiconductor layer; and (d) forming an electrode on the structure which has been fabricated so far through the steps (a) to (c).

The step (d) preferably includes the step of (e) forming a Schottky barrier layer or a second conductivity type fourth semiconductor layer of a relatively low concentration, in the top major surface of the first semiconductor layer at a region between neighboring ones of the third semiconductor layers.

The electrode preferably forms a Schottky barrier layer in the top major surface of the first semiconductor layer at a region between neighboring ones of the second semiconductor layers.

The step (d-1) may include the step of (d-2) thermally diffusing atoms of the electrode into the first semiconductor layer to thereby define a second conductivity type fourth semiconductor layer in the top major surface of the first semiconductor layer between neighboring ones of the second semiconductor layers such that the fourth semiconductor layer has a lower concentration than the concentration of the third semiconductor layer.

Alternatively, the step (d) may include the step of (d-3) implanting third ions of the second conductivity type from above to thereby define a second conductivity type fourth semiconductor layer in the top major surface of the first semiconductor layer between neighboring ones of the second semiconductor layers such that the fourth semiconductor layer has a lower concentration than the concentration of the third semiconductor layer.

Further, the step (d) may include the step of (d-4) disposing the electrode on an entire surface of the structure which has been fabricated so far through the steps (a) to (c), and the step (d-4) may be performed before the step (d-3).

Alternatively, the step (d) may further include the step of (d-5) disposing the electrode on an entire surface of the structure which has been fabricated so far through the steps (a) to (c) and (d-3).

The step (d) may further include the steps of: (d-6) disposing a metal on an entire surface of the structure which has been fabricated so far through the steps (a) to (c) to form the Schottky layer; and (d-7) disposing the electrode on an entire surface of the structure which has been fabricated so far through the steps (a) to (c) and (d-6).

In still other aspect, a method of manufacturing a semiconductor device comprises the steps of: (a) preparing a first conductivity type first semiconductor layer; (b) selectively covering a surface of the first semiconductor layer with a first mask; (c) implanting first ions of second conductivity type into the first semiconductor layer from above to thereby selectively form first seed cores in the first semiconductor layer under a region not covered with the first mask; (d) forming a first conductivity type second semiconductor layer on the first semiconductor layer; (e) covering a surface of the second semiconductor layer with a second mask at a region above the first seed cores and thereafter implanting second ions of the second conductivity type into the second semiconductor layer from above to thereby selectively form a second conductivity type third semiconductor layer in the second semiconductor layer under a region not covered with the second mask; (f) thermally treating the structure which has been fabricated so far through the steps (a) to (e) and thereby growing the first seed cores so that a second conductivity type fourth semiconductor layer of a relatively high concentration is formed; and (g) forming a second conductivity type fifth semiconductor layer of a relatively low concentration in a top surface of the second semiconductor layer at a region not covered with the third semiconductor.

In this aspect, the step (g) may include the step of (g-1) implanting third ions of the second conductivity type into the structure which has been fabricated so far through the steps (a) to (f) from above.

The step (g-1) may include the step of (g-2) disposing an electrode on an entire surface of the structure which has been fabricated so far through the steps (a) to (f).

The step (c) preferably includes the step of (e-1) forming second seed cores in the second semiconductor layer at a region under the second mask, and the step (g) preferably includes the step of (g-3) thermally growing the second seed cores into the fifth semiconductor layer.

A method of manufacturing a semiconductor device according to still other aspect comprises the steps of: (a) preparing a first conductivity type first semiconductor layer; (b) selectively covering a surface of the first semiconductor layer with a first mask; (c) implanting first ions of second conductivity type into the first semiconductor layer from above to thereby selectively form first seed cores in the first semiconductor layer under a region not covered with the first mask; (d) forming a first conductivity type second semiconductor layer on the first semiconductor layer; (e) covering a surface of the second semiconductor layer with a second mask at a region above the first seed cores and thereafter implanting second ions of the second conductivity type into the second semiconductor layer from above to thereby selectively form a second conductivity type third semiconductor layer in the second semiconductor layer under a region not covered with the second mask; (f) thermally treating the structure which has been fabricated so far through the steps (a) to (e) and thereby growing the first seed cores so that a second conductivity type fourth semiconductor layer of a relatively high concentration is formed; and (g) forming a Schottky barrier layer in top surfaces of the second semiconductor layers at a region not covered with the third semiconductor.

The step (g) preferably includes the step of (g-1) disposing an electrode on the structure which has been fabricated so far through the steps (a) to (f).

As heretofore described, during the reverse-bias state, a depletion layer develops between the first semiconductor layer and the second and the fourth semiconductor layers or between the first semiconductor layer, the second semiconductor layers and the Schottky barrier layer. Due to the existence of the third semiconductor layer, the depletion layer does not have a sharply curved configuration. Hence, concentration of an electric field and deterioration in the breakdown voltage are prevented.

On the other hand, during the forward-bias state, since the second semiconductor layers are selectively disposed in the first semiconductor layer, migration of excessive holes from the second semiconductor layers into the first semiconductor layer is avoided, thereby reducing a recovery current.

Thus, in the semiconductor device according to the present invention, injection of excessive carriers is controlled without degrading breakdown voltage $V_{BR}$. Hence, the recovery characteristics of the semiconductor device according to the present invention allow reduced recovery current $I_{RR}$ and subsequent gradual termination of current.

Such a semiconductor device is obtainable by the manufacturing method according to the present invention.

Accordingly, it is an object to offer a device structure in which implantation of excessive carriers is controlled without decreasing a breakdown voltage and with which a high speed soft recovery diode is realized.

These and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 5:
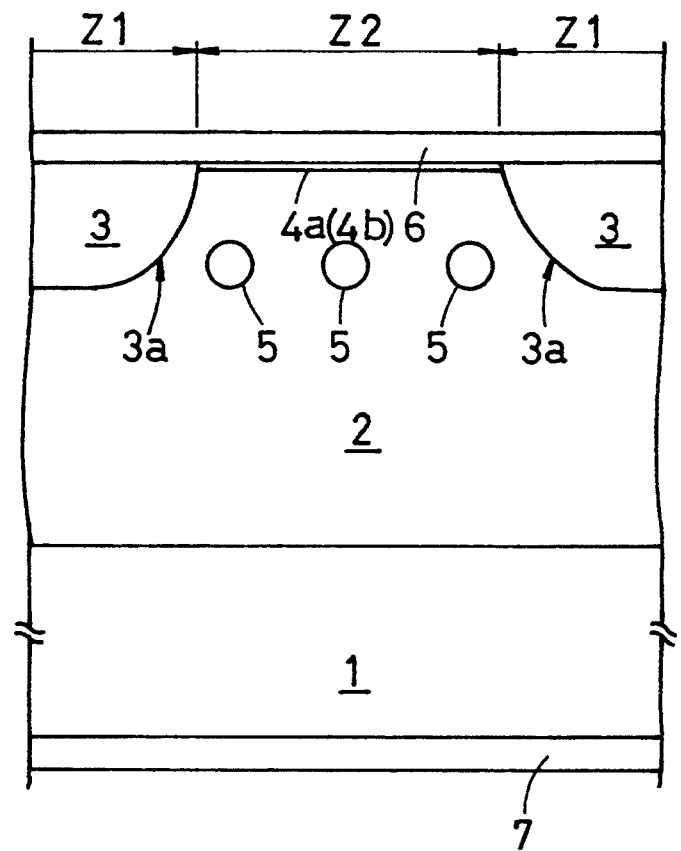
FIG. 5 is a cross sectional view illustrating a preferred embodiment of the present invention.

A preferred embodiment of the present invention will be described with reference to the drawings. FIG. 5 is a cross sectional view of a diode 100a. Anode P layers 3 are selectively formed in the top major surface of an $N^-$ body 2. Of the $N^-$ body 2, a portion lying under the anode P layers 3 and extending in the direction of the thickness of the $N^-$ body 2 is noted as a first zone Z1.

A shallow $P^-$ layer 4a is surrounded by the anode P layers 3 in the top major surface of the $N^-$ body 2. In other words, the top major surface of the $N^-$ body 2 is completely occupied by the anode P layers 3 and the $P^-$ layer 4a. The $N^{-60}$ body 2 includes a second zone Z2 which it lies under the $P^-$ layer 4a. The second zone Z2 also extends in the direction of the thickness of the $N^-$ body 2. Thus, the $N^-$ body 2 is divided into the first zone Z1 and the second zone Z2.

An anode electrode 6 is connected to both the anode P layers 3 and the $P^-$ layer 4a.

Figure 1:
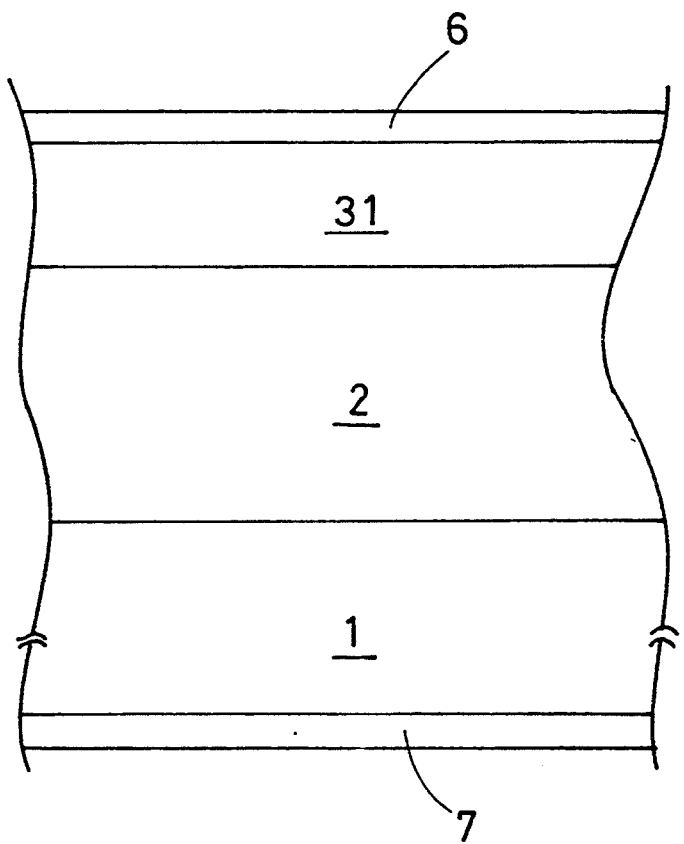
FIG. 1 is a cross sectional view illustrating a conventional diode.
Figure 2:
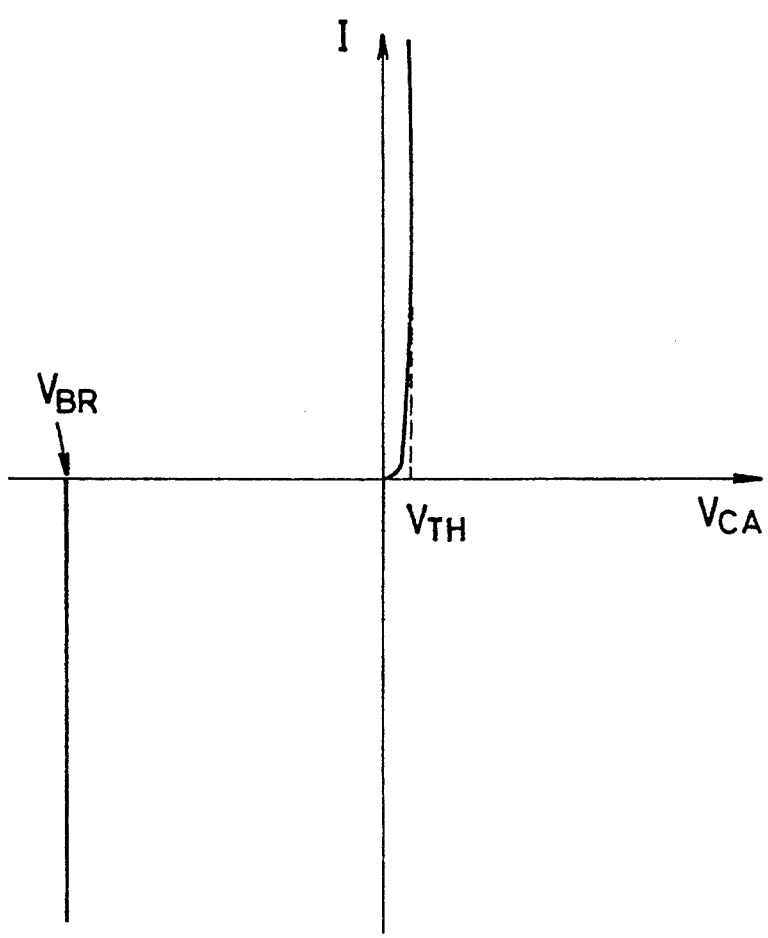
FIGS. 2 and 3 are graphs showing conventional characteristic.
Figure 3:
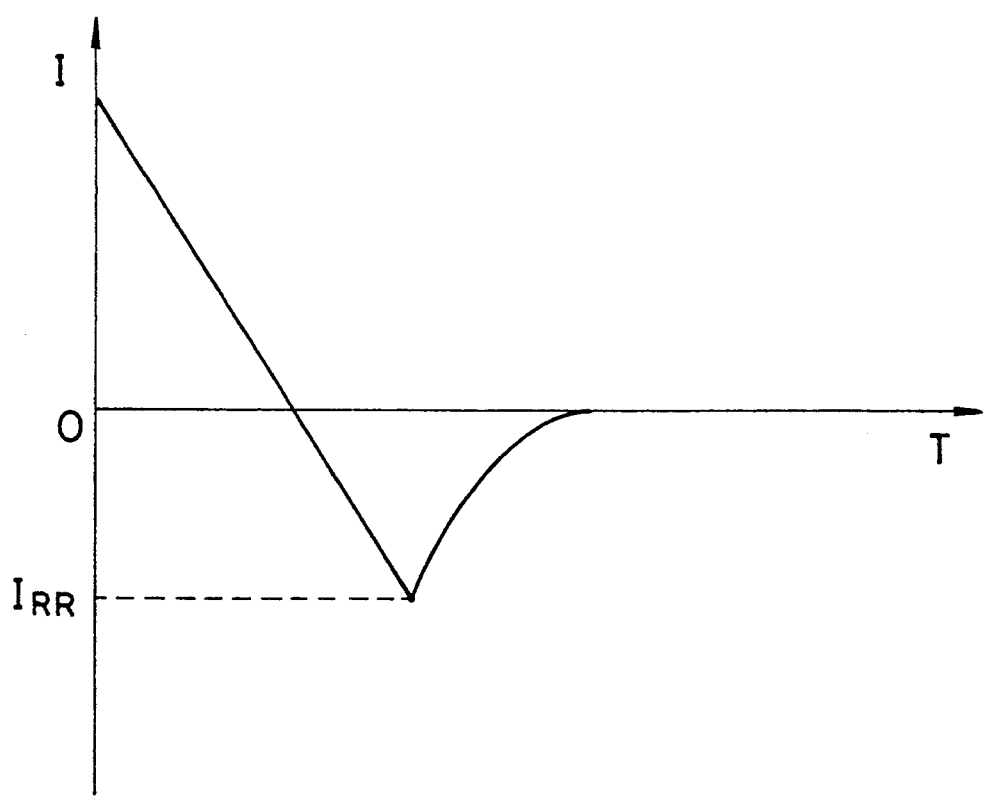
Figure 4:
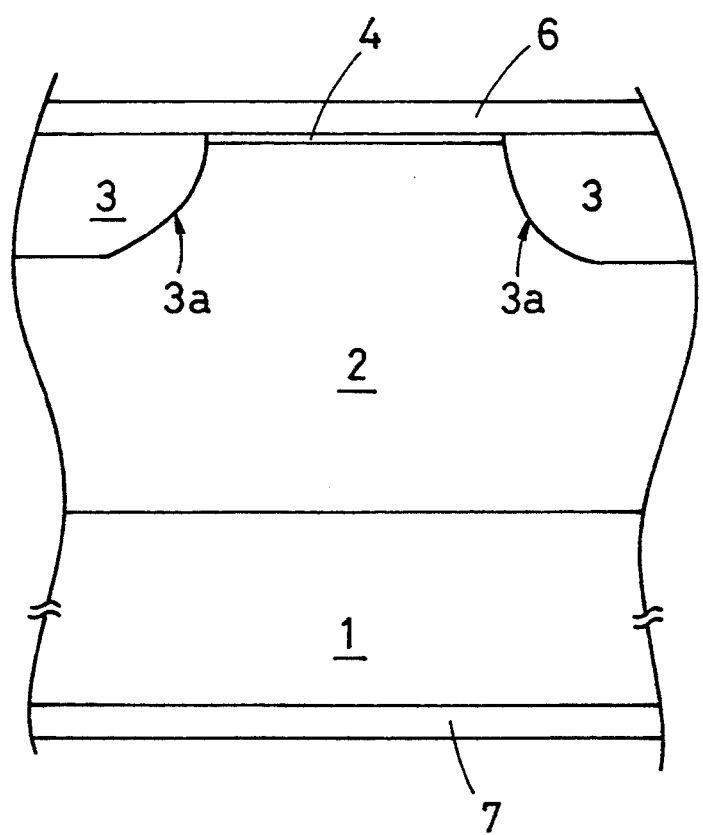
FIG. 4 is a cross sectional view illustrating a conventional diode.

A cathode $N^+$ layer 1 is disposed under the $N^-$ body 2 and a cathode electrode 7 is formed under the cathode $N^+$ layer 1, which structure remains similar to that of the diode 200 of FIG. 1.

In the diode 100a, P regions 5 are disposed in a distance away from the $P^-$ layer 4 in the second zone Z2. The configuration of each P region 5 resembles for instance, a column which extends perpendicular to the plane of FIG. 5. In terms of potential, the regions 5 are in a floating state.

Next, a current characteristic of the diode 100a will be described in comparison with those of the diodes 200 and 300. When the diode 100a is forwardly biased migration of excessive holes into the $N^-$ body 2 is better controlled, as in the case of the diode 300, than in the diode 200 since the anode P layers 3 are selectively formed.

Figure 6:
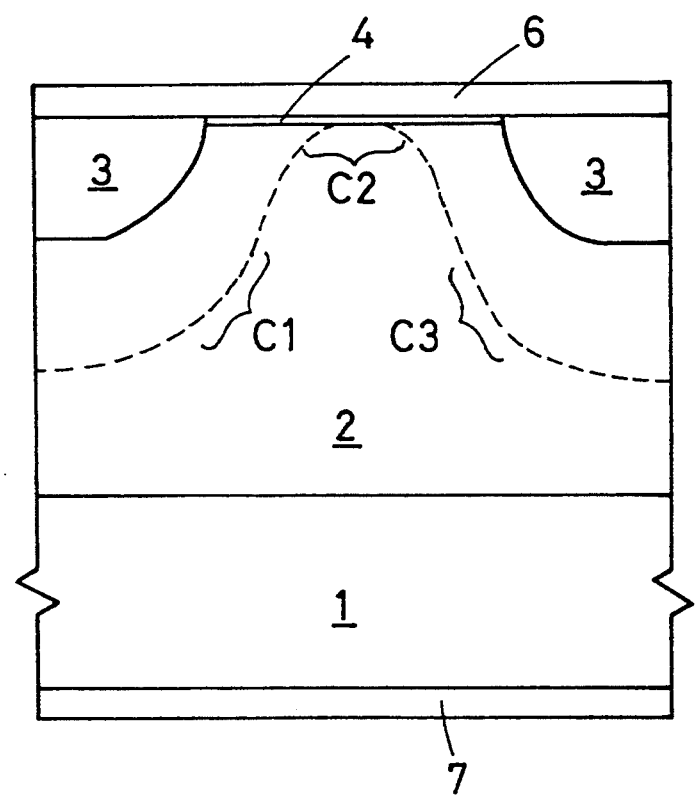
FIGS. 6 to 8 are cross sectional views for explaining an effect of the present invention.
Figure 7:
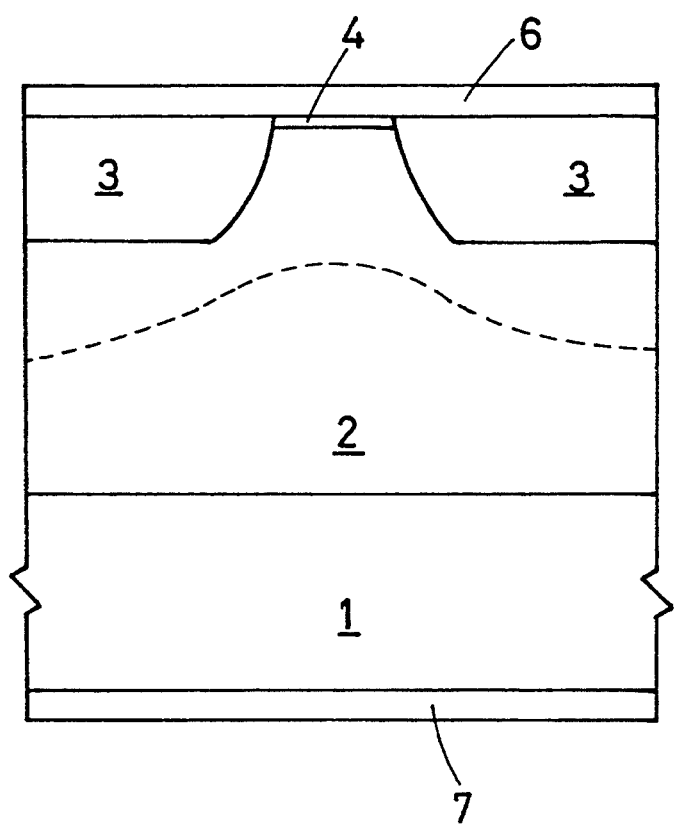

FIGS. 6 and 7 are cross sectional views of diodes 300a and 300b, respectively. The diodes 300a and 300b include a relatively wide aperture and a relatively narrow aperture, respectively, between the neighboring anode P layers 3 but have otherwise similar structure to the diode 300. FIGS. 6 and 7 show, with the dotted lines, spread of depletion layers which grow when the diodes 300a and 300b are reverse-biased.

In the diode 300a in which the aperture between the anode P layers 3 is relatively wide (FIG. 6), the depletion layer includes sharply curved portions C1, C2 and C3. At the portions C1, C2 and C3, an electric field would concentrate and would induce a drop in a breakdown voltage $V_{BR}$.

In the diode 300b in which the aperture of the anode P layers 3 is relatively narrow (FIG. 7), the depletion layer has a smooth contour. Hence, concentration of an electric field would not easily result, thus preventing deterioration in the breakdown voltage $V_{BR}$. In this structure, however, sufficient control of migration of excessive holes into the N⁻ body 2 is not possible.

In contrast, the diode 100a attains sufficient control of flow of excessive holes into the N⁻ body 2 since the aperture between the anode P layers 3 is relatively wide, and at the same time, suppresses field concentration.

Figure 8:
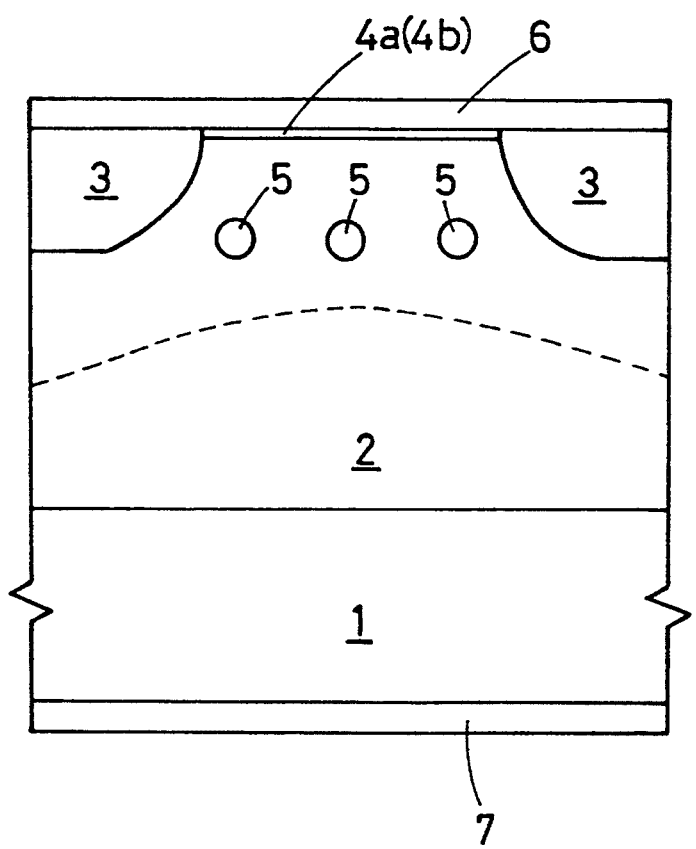

FIG. 8 is a cross sectional view showing how a depletion layer grows when the diode 100a is reverse-biased (the dotted line). The P regions 5 serve as a guard ring during a reverse-bias state of the diode 100a. More precisely, the depletion layer would extend down to the P regions 5, to finally completely enclose the anode P layers 3, the P⁻ layer 4a and the P regions 5. Since the depletion layer includes no sharply curved portion in its configuration, concentration of electric field is restrained, and hence, the breakdown voltage $V_{BR}$ would not fall.

This allows the aperture between the anode P layers 3 to be widened with an aim to sufficiently control migration of excessive holes into the N⁻ body 2, while preventing the conditions for the breakdown voltage $V_{BR}$ in a reverse-bias.

Such an effect is attainable in a slightly modified diode 100b (FIGS. 5 and 8) in which a Schottky barrier layer 4b replaces the P⁻ layer 4a.

Embodiment 2

Figure 9:
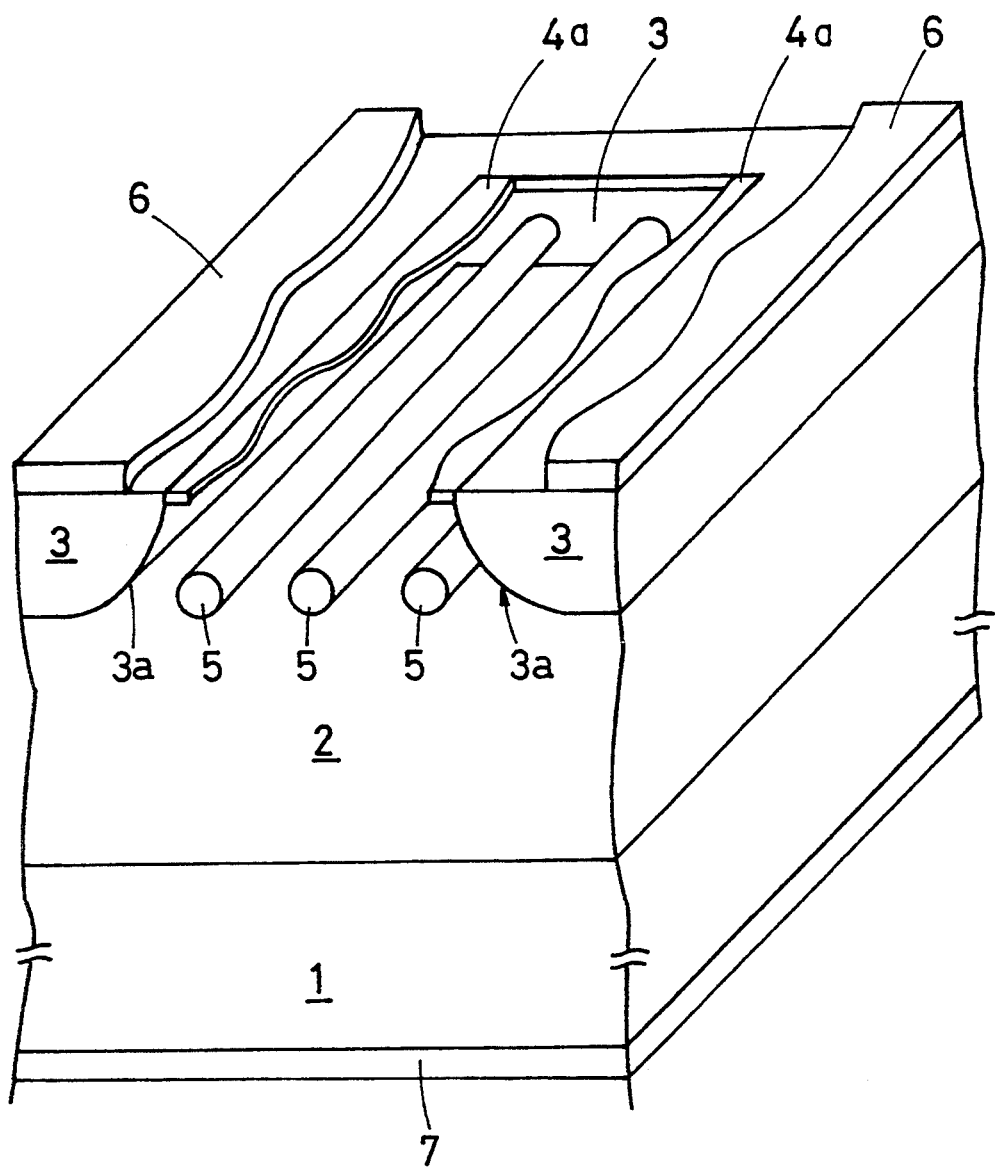
FIG. 9 is a cross sectional view illustrating another preferred embodiment of the present invention.

FIG. 9 is a partially cutaway cross sectional view of a diode 100c according to another preferred embodiment of the present invention. Similar to the diode 100a, the diode 100c requires that the P regions 5 are disposed apart from the P⁻ layer 4a in the N⁻ body 2. Here, however, the column-like shaped P regions 5 are connected to the anode P layers 3.

Where the P regions 5 are thus connected to the anode P layers 3, holes flow into the N⁻ body 2 also from the P regions 5 during forward-bias state, such that the migration of holes are less effectively controlled than in the diodes 100a and 100b. However, as compared with the diode 200, in which the anode P layers 3 are formed entirely over the N⁻ body 2, injection of the holes is better restrained in the diode 100c.

When the diode 100c is reversely biased, the resultant breakdown voltage $V_{BR}$ is larger than those attained in the diodes 100a and 100b since the P regions 5 are connected to the anode electrode 6 through the anode P layers 3.

This effect is achievable in a modified diode 100d, too, (FIG. 9) which comprises a Schottky barrier layer 4b instead of the P⁻ layer 4a.

Figure 10:
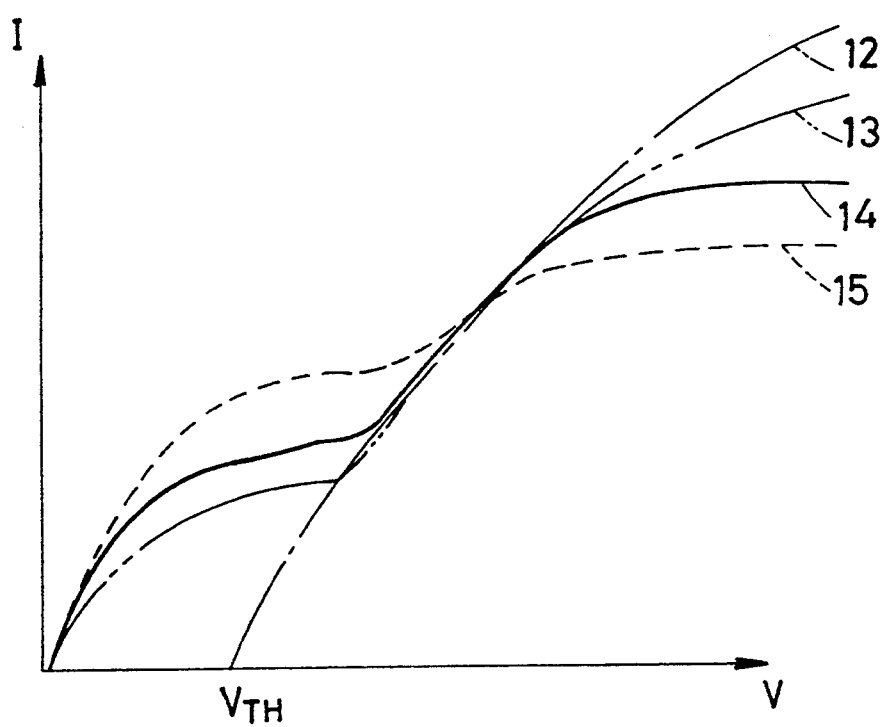
FIG. 10 is a graph for explaining an effect of the present invention.

FIG. 10 shows the current characteristics of the conventional diode and the diodes according to the present invention each during forward-bias state. The curves 12, 13, 14 and 15 represent the diodes 200, 300, 100a and 100c, respectively. The illustrated current characteristics are measured on the premise that the aperture between the anode P layers 3 is widened to such an extent that deterioration in the breakdown voltage would not occur.

In the diode 200, since the anode P layer 31 entirely covers the top surface of the N⁻ body 2, current starts flowing at a threshold voltage $V_{TH}$ or a voltage greater than that (Curve 12).

In the diode 300, current is first initiated between the P⁻ layer 4 and the N⁻ body 2. Hence, the diode 300 has such a current characteristic that current starts at a voltage lower than the voltage which is required to initiate current in the diode 200. With increase in the applied voltage, current tends to saturate until another current flow is created between the anode P layers 3 and the N⁻ body 2. With further increase in the applied voltage, joined by the current which flows between the anode P layers 3 and the N⁻ body 2, greater current starts flowing. Hence, the curve indicating the current characteristic of the diode 300 runs stepwisely (Curve 13). In a region where the applied voltage is large, current is smaller than that flowing in the diode 200 due to differences in the amount of the migrated holes from the anode P layers 3.

This is also true in the diodes 100a and 100b. Since the anode P layers 3 are selectively formed in the N⁻ body 2, current, which flows in a region where the applied voltage is large, is smaller than current which flows in the diode 200 (Curves 14 and 15).

In a region where the applied voltage is small, current is initiated at a smaller voltage than the voltage which is required to initiate current in the diode 200. However, at a current rising point, the current characteristic of the diode 100c (Curve 15) has a larger value than the current characteristic of the diode 100a (Curve 14). This is believed to be caused by a fact that the P regions 5 inject holes as the anode P layers 3 do.

Manufacturing Method

Described in the following is a method of manufacturing the diode 100a and the other diodes which have been explained as the first and the second preferred embodiments.

A. First Manufacturing Method

Figure 11:
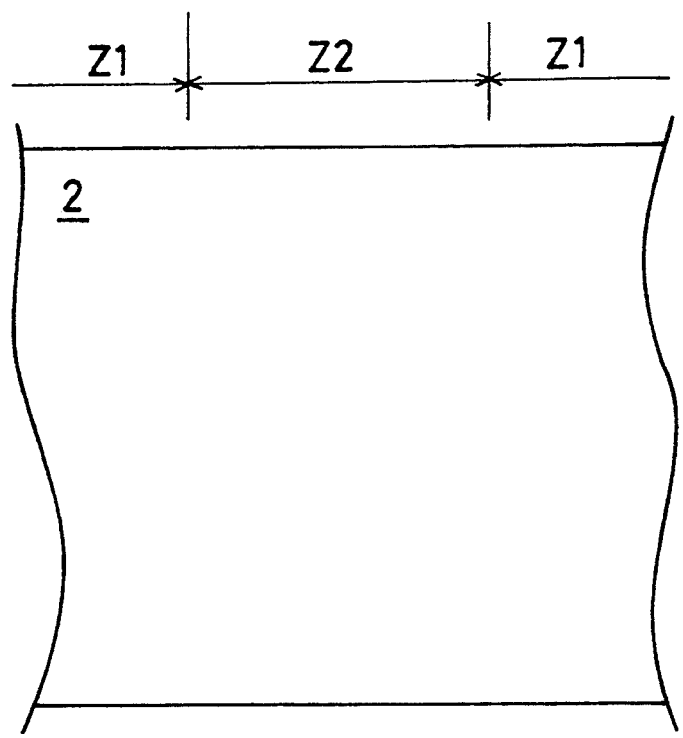
FIGS. 11 to 17 are cross sectional views showing a method of manufacturing a semiconductor device according to a preferred embodiment of the present invention in the respective process steps.
Figure 12:
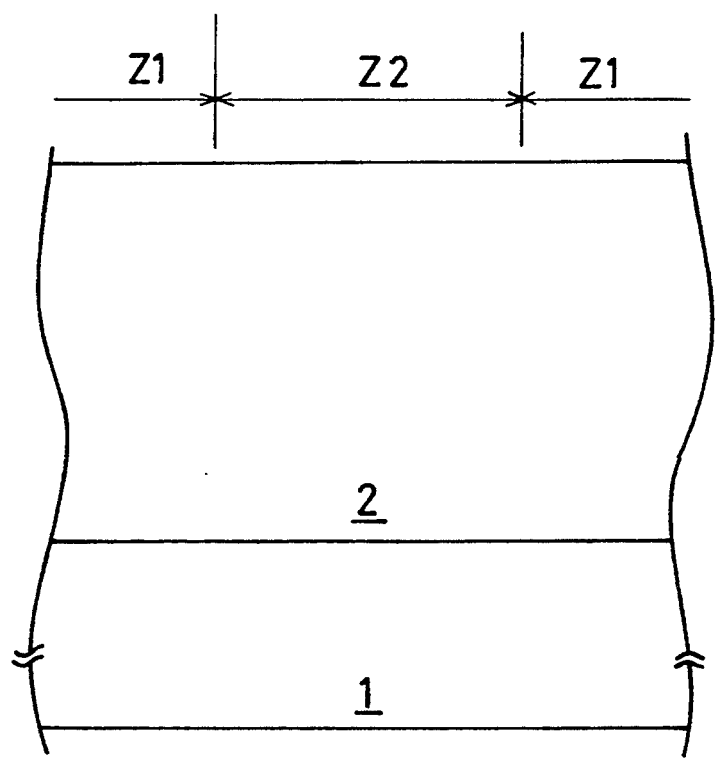

First, the N⁻ body 2 is prepared which serves as a semiconductor substrate. The N⁻ body 2 is partitioned into the first zone Z1, where the anode P layers 3 are to be formed on the top major surface, and the second zone Z2, where the P⁻ layer 4a or the Schottky barrier layer 4b is formed on the top major surface, both penetrating the N⁻ body 2 in the direction of thickness of the N⁻ body 2 (FIG. 11). The cathode N⁺ layer 1 is formed under the N⁻ body 2 (FIG. 12).

Figure 13:
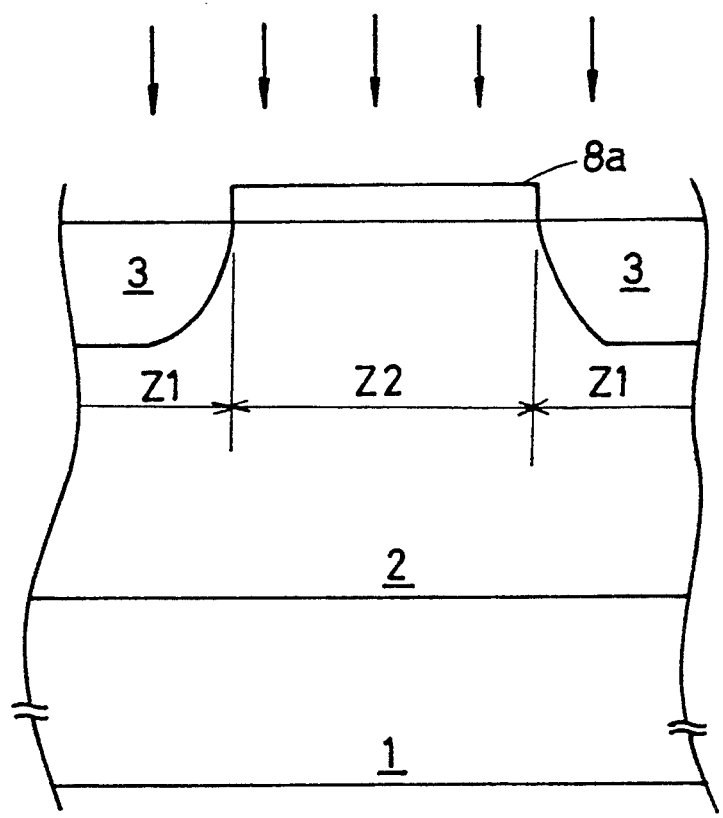

The surface of the second zone Z2 is then coated with a resist 8a through which P type impurity ions are implanted down into the N⁻ body 2, whereby the anode P layers 3 arc disposed on the surface of the first zone Z1 (FIG. 13).

Figure 14:
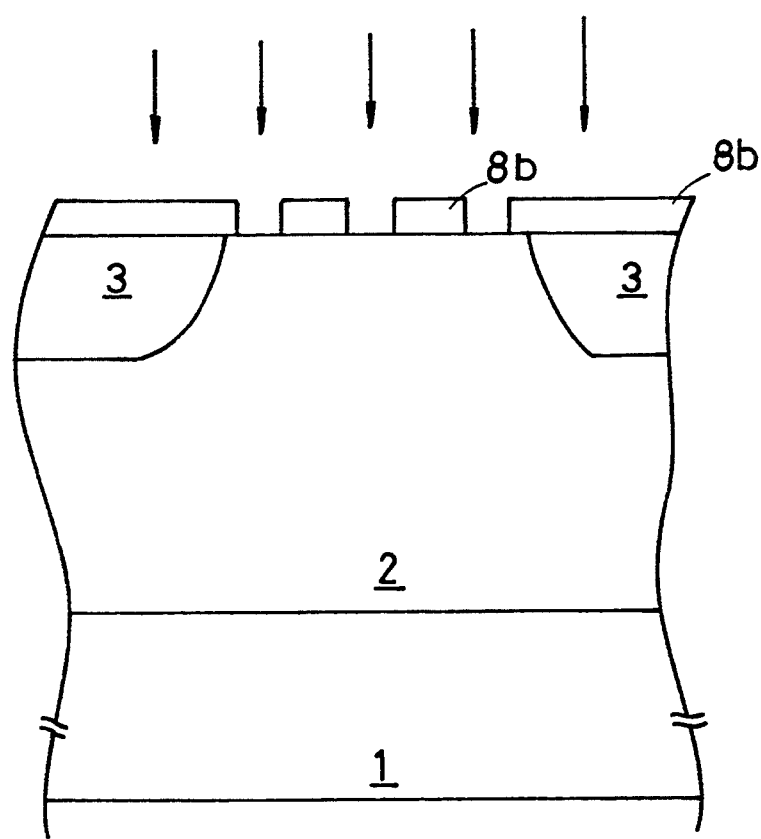

Next, the resist 8a is removed and a resist 8b is formed which not only locally covers the second zone Z2 but also overlies the first zone Z1. P type impurity ions are implanted through the resist 8b into the N⁻ body 2 from above using a relatively high energy (FIG. 14).

Figure 15:
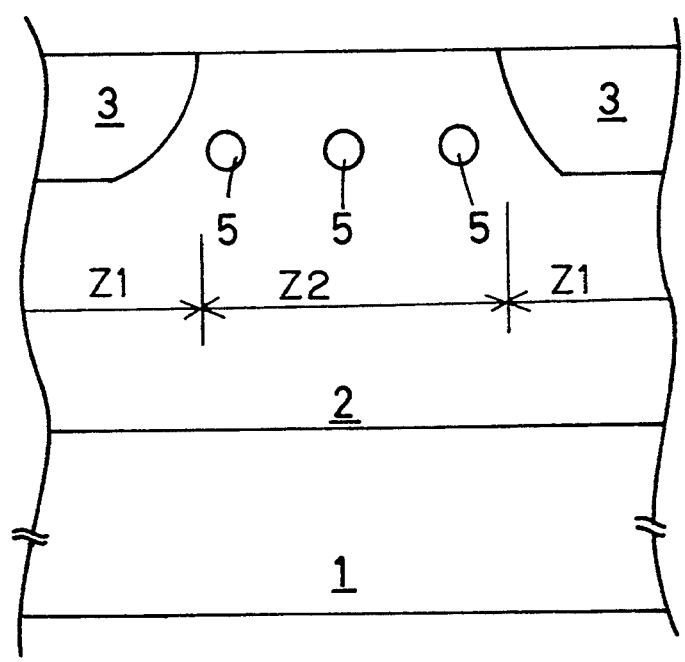

The resist 8b is removed and the structure is annealed, thereby forming the P regions 5 selectively in the second zone Z2 (FIG. 15).

Figure 16:
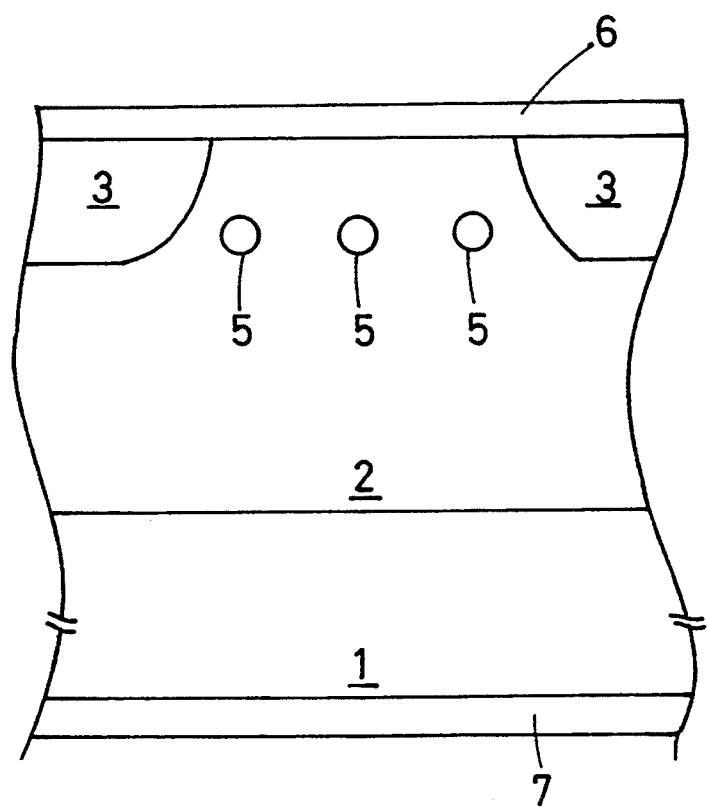
Figure 17:
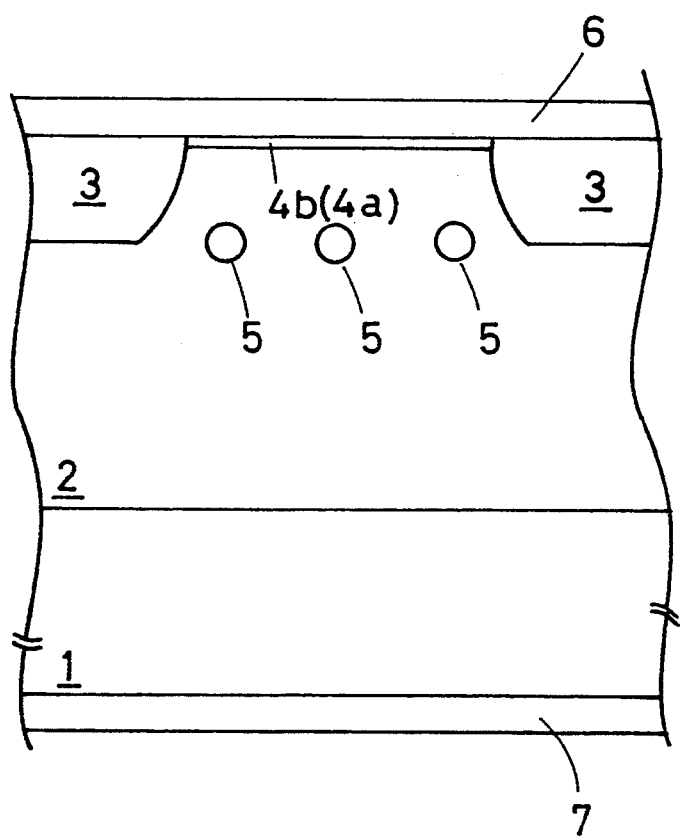

The cathode electrode 7 is formed under the cathode N⁺ layer 1 and the anode electrode 6 is disposed on the N− body 2 and the anode P layers 3 (FIG. 16). By forming the anode electrode 6 from such material creates a Schottky barrier in the N− body 2. The Schottky barrier layer 4b in FIG. 17 is obtained merely by provision of the anode electrode 6. Silicon is a good candidate for the material of the N− body 2 and aluminum is a good candidate for the material of the anode electrode 6.

Figure 18:
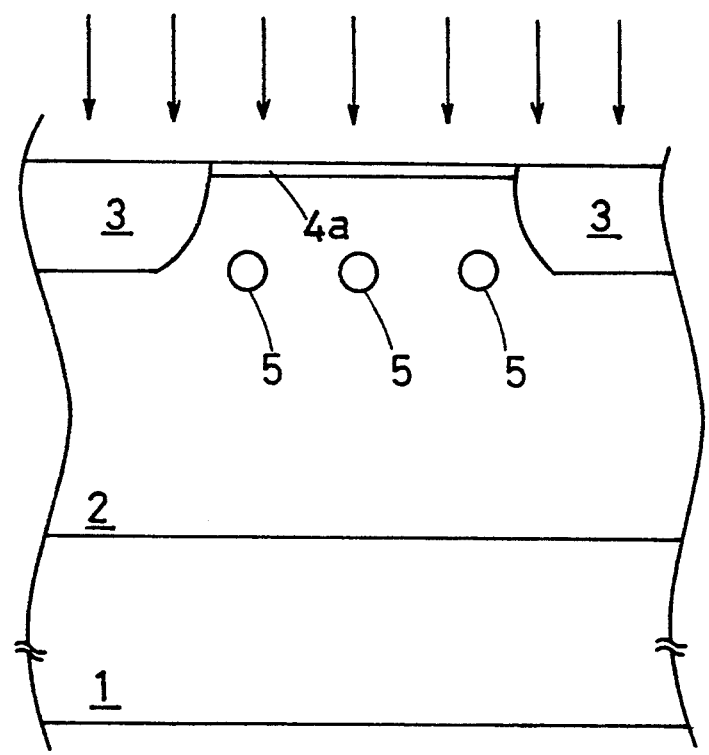
FIGS. 18 to 21 are cross sectional views showing a method of manufacturing a semiconductor device according to a preferred embodiment of the present invention.
Figure 19:
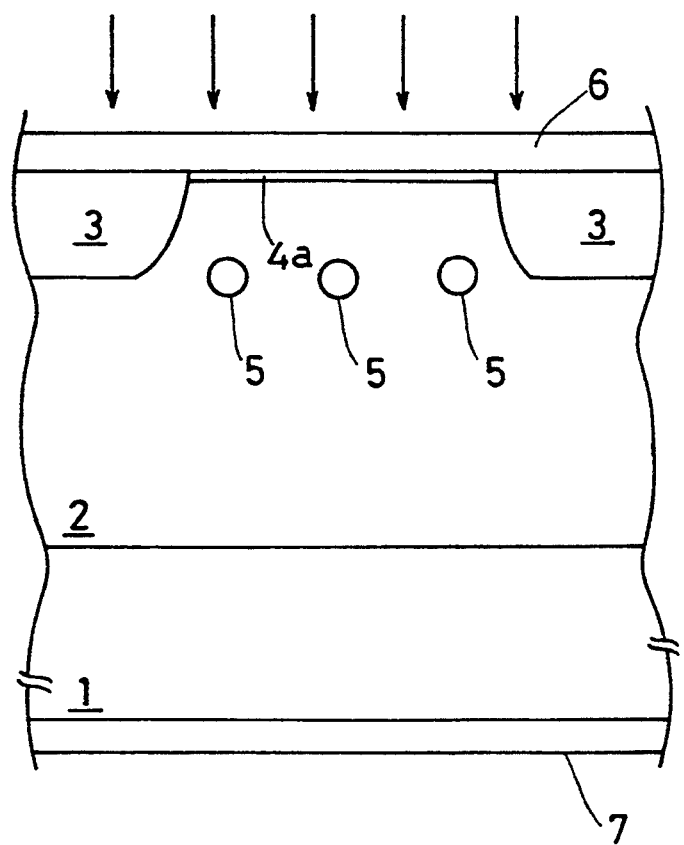

Through further annealing, aluminum diffuses as P type impurities in the silicon material of the N− body 2, thereby defining the P− layer 4a (FIG. 17). The P− layer 4a may be otherwise formed above the P regions 5 by additional implantation of P type impurities from above followed by the anode electrode 6 as shown in FIG. 18. Although, this ion implantation also injects impurities into the anode P layers 3, since the anode P layers 3 have a high concentration and have the same conductivity as that of the injected impurities, the implantation of such a dose needed for the formation of the P− layer 4a is far easier than to modify the characteristics of the anode players 3. Alternatively, the P− layer 4a may be formed by implantation of P type impurities through the anode electrode 6 as shown in FIG. 19. The diode 100a and the like are completed in this manner.

Figure 20:
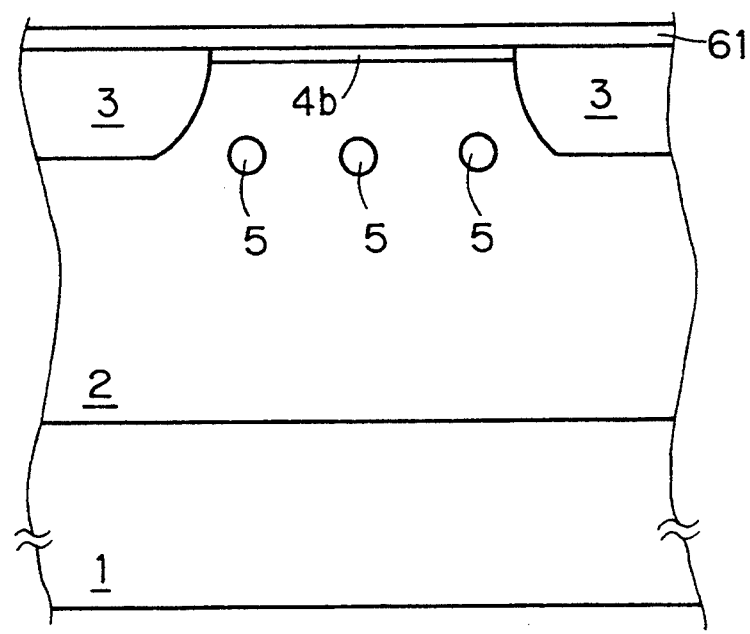
Figure 21:
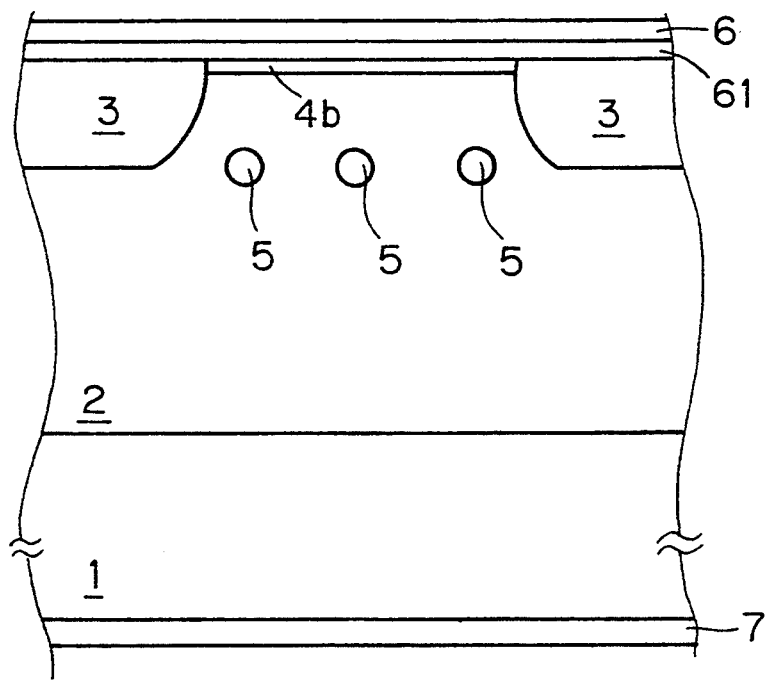

It is also to be noted that, instead of forming the P− layer 4a by implantation of P type impurities, (metal which would form a Schottky barrier to silicon, the material of which the N− body 2 is made, such as a TiW film (61 may be formed on the entire top surface of the N− body 2 in order to obtain the Schottky barrier layer 4b before formation of the anode electrode 6. FIG. 20 is a cross sectional view showing a step of forming the TiW film 61 following the step shown in FIG. 15. During formation of the TiW film 61 on the entire top surface of the N− body 2, the anode P layers 3 would also be covered at top surfaces with the TiW film 61. However, since the anode P layers 3 have a high impurity concentration, the TiW film 61 and the anode P layers 3 would form an ohmic contact. Hence, the Schottky barrier layer 4b is not formed on the anode P layers 3. After formation of the Schottky barrier layer 4b, the anode and the cathode electrodes 6 and 7 are formed on the top surface of the N− type body 2 and under the cathode N+ layer 1, respectively, completing the diode 101 (FIG. 21).

Figure 22:
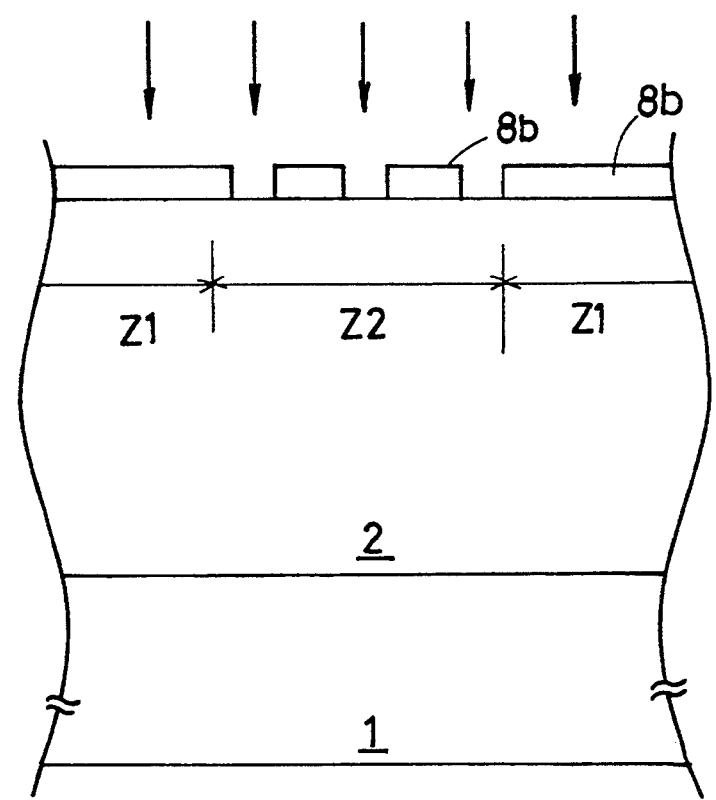
FIGS. 22 to 24 are cross sectional views showing another method of manufacturing a semiconductor device according to the present invention in the respective process steps.

The P regions 5 may be formed before provision of the anode P layers 3, in which case, as shown in FIG. 22, the resist 8b is formed to selectively cover the surface of the second zone Z2 and entirely cover the surface of the first zone Z1. Then, P type impurity ions are implanted through the resist 8b down into the N− body 2.

Figure 23:
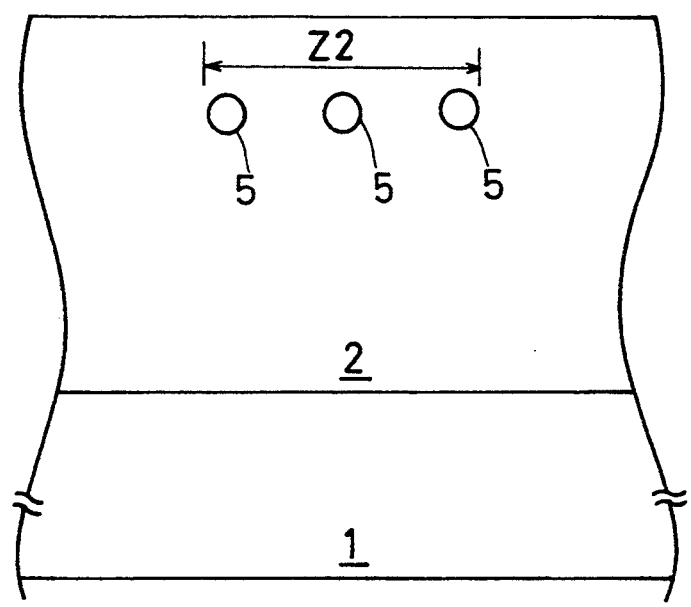

The resist 8b is then removed followed by annealing, whereby the P regions 5 are selectively formed in the second zone Z2 (FIG. 23).

Figure 24:
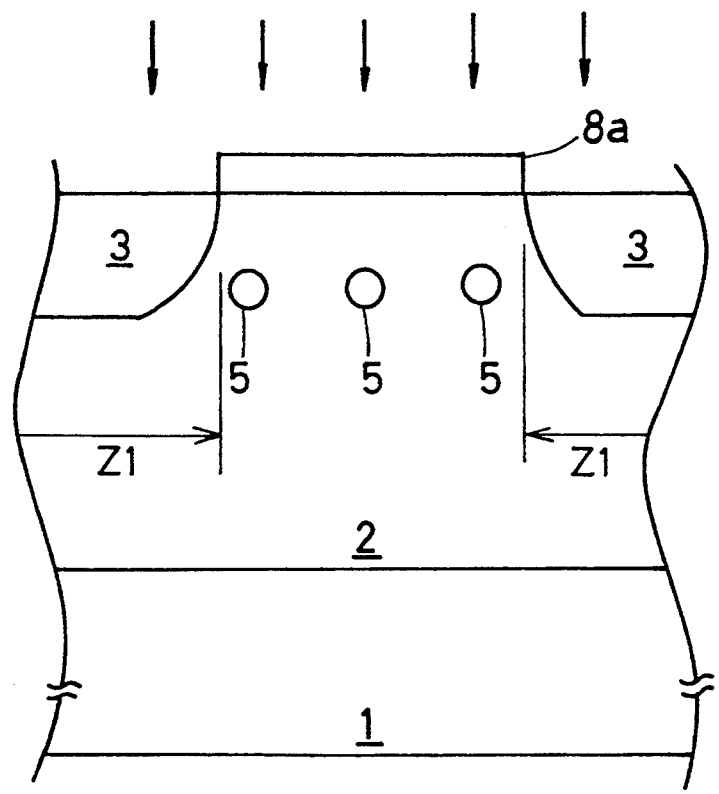

The surface of the second zone Z2 is further coated with the resist 8a through which P type impurity ions are implanted into the N− body 2 from above. As a result, the anode P layers 3 are formed in the surface of the first zone Z1 (FIG. 24). Following this, through steps similar to those shown in FIGS. 16 and 17 or those shown in FIGS. 18 to 21, the diode 100 or the like is completed.

B. Second Manufacturing Method

The semiconductor device of the present invention is also obtainable through the process steps which are illustrated in FIGS. 25 to 30.

Figure 25:
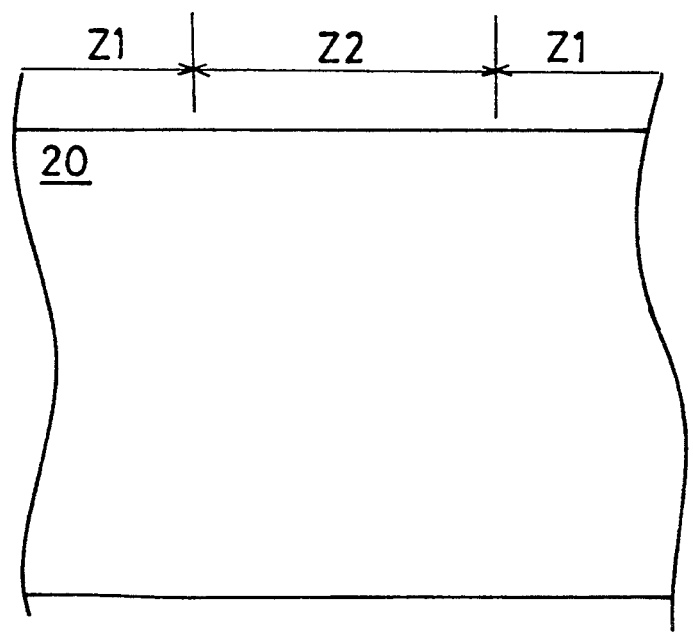
FIGS. 25 to 30 are cross sectional views showing still another method of manufacturing a semiconductor device according to the present invention in the respective process steps.
Figure 26:
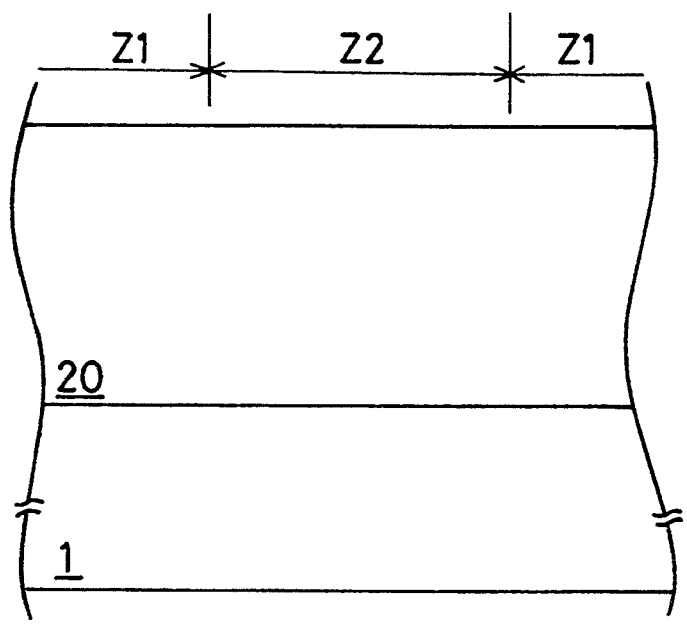

First, an N− semiconductor substrate 20 is prepared. The N− semiconductor substrate 20 is then divided into the first zone Z1, where the anode P layers 3 are to be formed on the top major surface, and the second zone Z2, where the P− layer 4a or the Schottky barrier layer 4b is to be formed on the top major surface, both penetrating the N− semiconductor substrate 20 in the direction of the thickness of the N− body 2 (FIG. 25). The cathode N+ layer 1 is formed under the N− semiconductor substrate 20 (FIG. 26).

Figure 27:
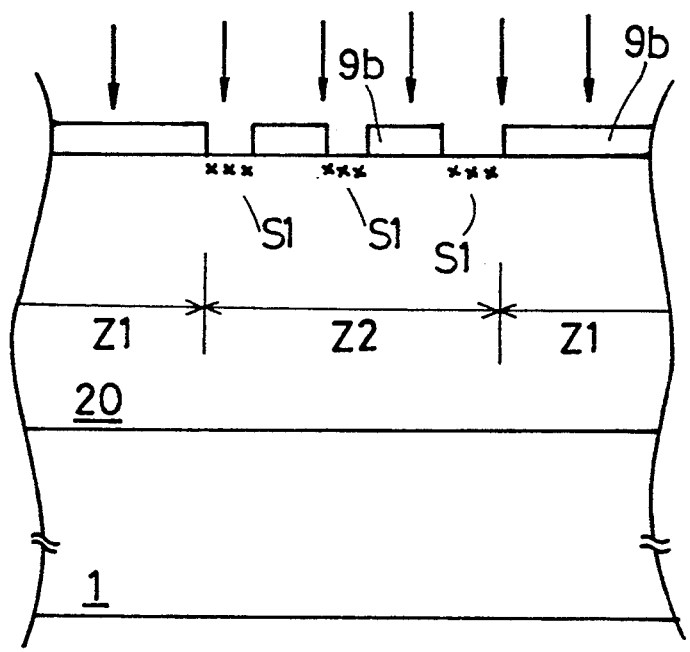

A resist 9b is formed which selectively covers the surface of the second zone Z2 and overlies the entire surface of the first zone Z1. P type impurity ions are then implanted into the semiconductor substrate 20 from above so that seed cores S1 containing the P type impurity ions which are to diffuse are selectively formed inside the second zone Z2 (FIG. 27).

Figure 28:
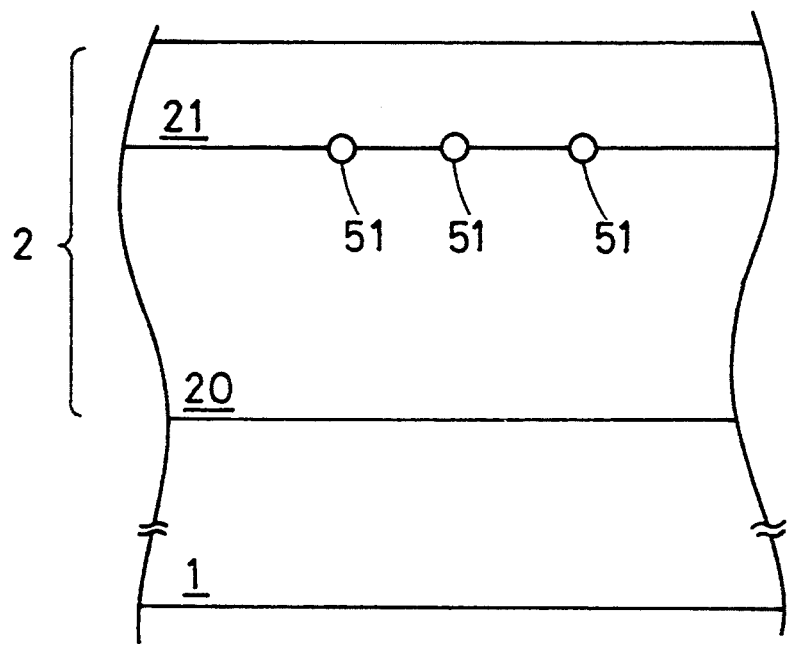

Following this, the resist 9b is removed and an N− semiconductor layer 21 is epitaxially grown on the entire surface of the semiconductor substrate 20. The semiconductor substrate 20 and the semiconductor layer 21 form the N− body 2. As the epitaxial growth of the semiconductor layer 21 proceeds, the seed cores S1 spread to thereby form P regions 51 (FIG. 28).

Figure 29:
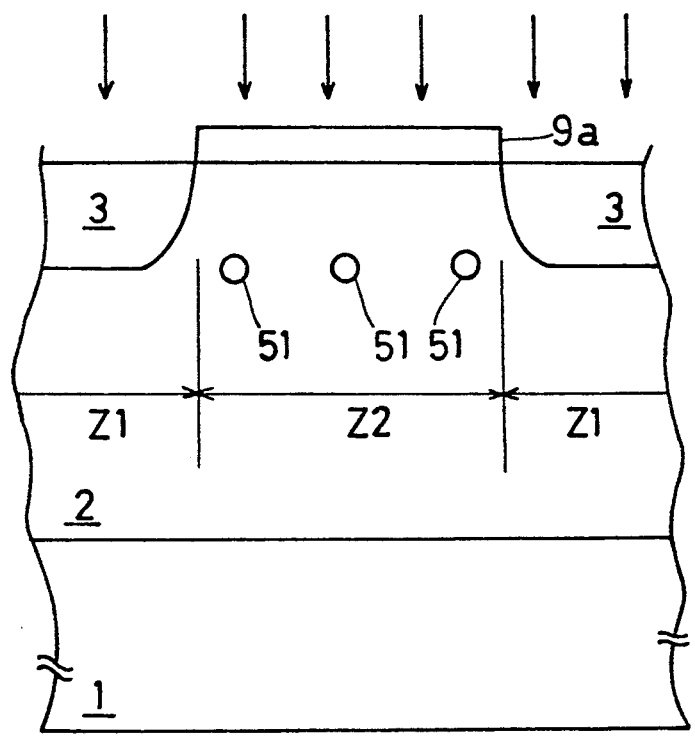

The surface of the N− body 2 (i.e., the surface of the semiconductor layer 21) is coated in the second zone Z2 with a resist 9a through which P type impurity ions are struck down into the N− body 2. As a result, the anode P layers 3 are formed on the surface of the N− body 2 in the first zone Z1 (FIG. 29).

Figure 30:
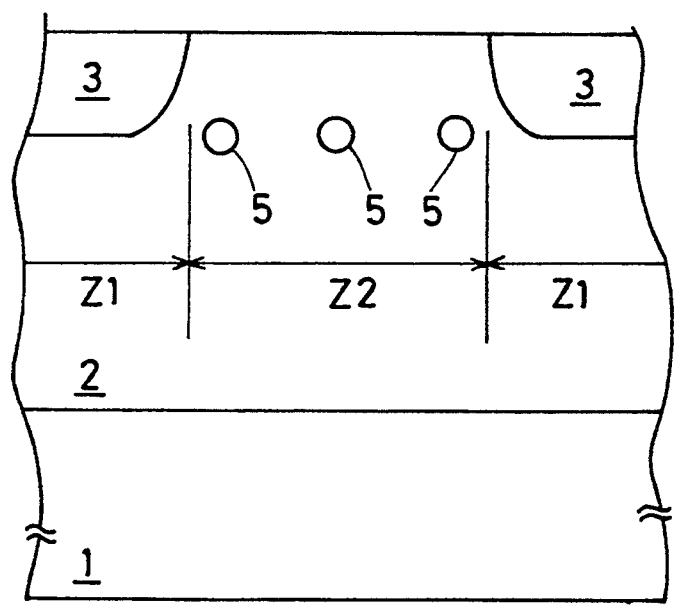

The resist 9a is thereafter removed and the structure is annealed, allowing further spread of the P regions 51 which will consequently become the P regions 5 (FIG. 30).

As in the first manufacturing method, the Schottky barrier layer 4b may be formed by forming the anode electrode 6 (FIG. 17), or the anode P− layer 4a may be formed by further annealing (FIG. 17), or the structure may be doped before forming the anode electrode 6 (FIG. 18). Alternatively, impurities may be implanted after forming the anode electrode 6 (FIG. 19). A further alternative is to form the Schottky barrier layer 4b before formation of the anode electrode 6 (FIG. 20).

Then, the anode electrode 6 and the cathode electrode 7 are disposed on the N− body 2 and under the cathode layer 1, respectively, thus completing the diode 100a and the other diodes.

Figure 31:
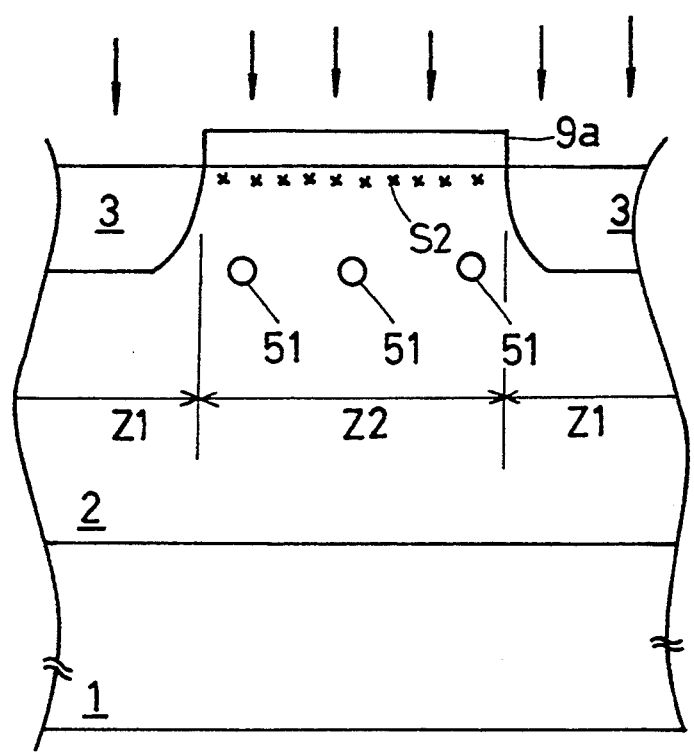
FIG. 31 is a cross sectional view showing still another method of manufacturing a semiconductor device according to a preferred embodiment of the present invention.

Still, another modification is possible. By injecting the P type impurities down into the N− body 2 under appropriately adjusted ion implant conditions, an anode P layer is formed on the portion of the N− body 2 not covered with the resist 9a (above the first zone Z1) and P-impurity-ion-contained seed cores S2 are formed in the surface of the N− body 2 (above the second zone Z2) through the resist 9a (FIG. 31). In this case, the structure is annealed after removal of the resist 9a so that the P regions 51 grow into the P regions 5 and the seed cores S2 spread into the P− layer 4a.

Embodiment 3

The positional relation between the P regions 5 and the anode P layers 3 may not be as heretofore described.

Figure 32:
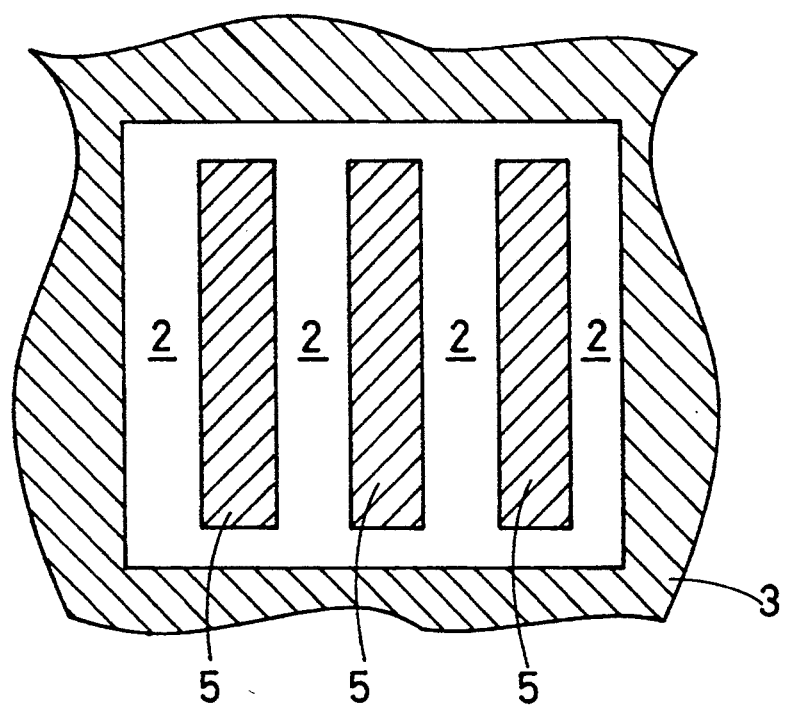
FIG. 32 is a plan view showing a preferred embodiment of the present invention.
Figure 33:
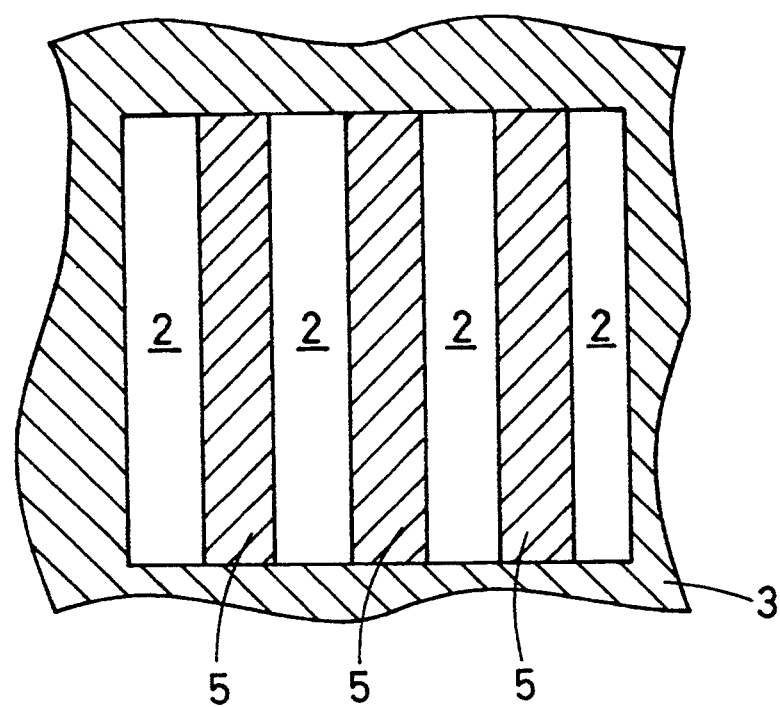
FIG. 33 is a plan view showing another preferred embodiment of the present invention.
Figure 34:
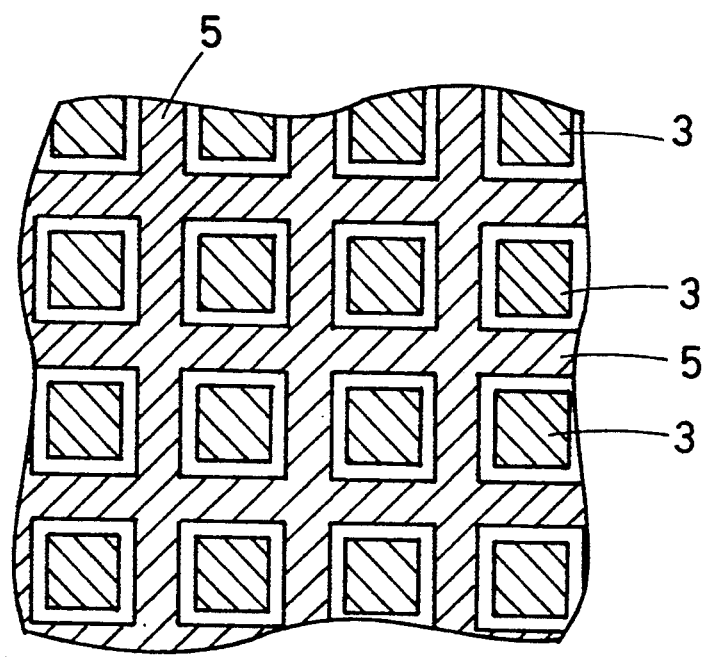
FIG. 34 is a plan view showing a modification of the present invention.

FIGS. 32 and 33 are plan views corresponding to the diodes 100a and 100b, respectively. Except for a minor difference concerning connection between the P regions 5 and the anode P layers 3, the two plane structures are similar in that the P regions 5 each extend in a column-like shape. The plane configuration of the P regions 5, however, may be as shown in FIG. 34 wherein the anode P layers 3 each have an island-like shape and is surrounded by the P regions 5. This is acceptable because the first and the second zones Z1 and Z2 only have to be complementary to each other.

While the invention has been &scribed in detail, the foregoing description is in all aspects illustrative and not restrictive. It is understood that numerous other modifications and variations can be devised without departing from the scope of the invention.

I claim:

1. A semiconductor device comprising:
   a first conductivity type first semiconductor layer;
   second conductivity type second semiconductor layers of a relatively high concentration, said second semiconductor layers being selectively formed in a top major surface of said first semiconductor layer;
   at least one third semiconductor layer of said second conductivity type having a relatively high concentration, said third semiconductor layer being selectively formed in said first semiconductor layer at a region between neighboring ones of said second semiconductor layers; and
   a second conductivity type fourth semiconductor layer of relatively low concentration, said fourth semiconductor layer being formed in said top major surface of said first semiconductor layer at a region between neighboring ones of said second semiconductor layers.

2. The semiconductor device of claim 1, further comprising a first conductivity type fifth semiconductor layer of a higher concentration than the concentration of said first semiconductor layer, said fifth semiconductor layer being disposed under a bottom major surface of said first semiconductor layer.

3. The semiconductor device of claim 2, further comprising a first electrode which is disposed in contact with both said second semiconductor layers and said fourth semiconductor layer.

4. The semiconductor device of claim 3, further comprising a second electrode which is disposed under a bottom major surface of said fifth semiconductor layer.

5. The semiconductor device of claim 4, wherein a plurality of said third semiconductor layers are provided.

6. The semiconductor device of claim 1, wherein said second and said third semiconductor layers are connected to each other.

7. The semiconductor device of claim 6, wherein said third semiconductor layer has a column-like configuration.

8. The semiconductor device of claim 6, wherein said second semiconductor layers surround said fourth semiconductor layer in said major top surface of said first semiconductor layer.

9. The semiconductor device of claim 1, wherein said second and said third semiconductor layers are separated from each other.

10. The semiconductor device of claim 9, wherein said third semiconductor layer has a column-like configuration.

11. The semiconductor device of claim 9, wherein said second semiconductor layers surround said fourth semiconductor layer in said major top surface of said first semiconductor layer.

* * * * *